(12) United States Patent
Watanabe et al.

(10) Patent No.: US 8,336,195 B2
(45) Date of Patent: Dec. 25, 2012

(54) ELECTRONIC COMPONENT MOUNTING APPARATUS

(75) Inventors: Akio Watanabe, Ota (JP); Akihiro Kawai, Isesaki (JP); Tetsuji Ono, Ora-Gun (JP); Makio Kameda, Fukaya (JP); Kazuyoshi Oyama, Ashikaga (JP); Kazuyoshi Ieizumi, Ota (JP)

(73) Assignee: Hitachi High-Tech Instruments Co., Ltd., Gunma (JP)

( * ) Notice: Subject to any disclaimer, the term of this patent is extended or adjusted under 35 U.S.C. 154(b) by 186 days.

(21) Appl. No.: 12/727,349

(22) Filed: Mar. 19, 2010

(65) Prior Publication Data

US 2010/0186223 A1 Jul. 29, 2010

Related U.S. Application Data

(62) Division of application No. 11/605,471, filed on Nov. 29, 2006, now Pat. No. 7,712,208.

(30) Foreign Application Priority Data

Nov. 30, 2005 (JP) .................................. 2005-345114

(51) Int. Cl.
*B23P 19/00* (2006.01)

(52) U.S. Cl. ............... 29/740; 29/833; 226/45; 700/259

(58) Field of Classification Search ............ 29/720–722, 29/739, 740, 832–834; 70/225; 226/32, 226/45, 137; 414/730, 744.2, 752.1; 700/213, 700/259
See application file for complete search history.

(56) References Cited

U.S. PATENT DOCUMENTS

| | | | |
|---|---|---|---|
| 5,539,977 A | 7/1996 | Kano et al. | |
| 5,694,219 A | 12/1997 | Kim | |
| 6,157,870 A | 12/2000 | Gfeller et al. | |
| 6,356,352 B1 | 3/2002 | Sumi et al. | |
| 6,631,552 B2 | 10/2003 | Yamaguchi | |

(Continued)

FOREIGN PATENT DOCUMENTS

EP 0 967 851 12/1999

(Continued)

OTHER PUBLICATIONS

Watanabe et al., U.S. Office Action mailed Sep. 9, 2011, directed to U.S. Appl. No. 12/349,249; 9 pages.

(Continued)

*Primary Examiner* — Donghai D. Nguyen
(74) *Attorney, Agent, or Firm* — Morrison & Foerster LLP

(57) ABSTRACT

The invention is directed to an unfailing pickup operation of an electronic component from a component storage portion at a seam of storage tapes connected even using a connection tape and prevention of reduction in a pickup rate of an electronic component. A CPU sends a feeding command to a component feeding unit to perform a component feeding operation or the like. Then, when the CPU judges that a connection tape reaches a pickup position, the CPU drives an X axis drive motor and a Y axis drive motor to move a board recognition camera to the pickup position of the feeding unit, the camera takes an image of a storage portion of a storage tape, and a recognition processing device performs recognition processing. A correction value based on a result of this recognition processing is stored in a RAM, and a suction nozzle is moved taking this correction value into account and lowers to pick up an electronic component.

2 Claims, 7 Drawing Sheets

U.S. PATENT DOCUMENTS

| | | | |
|---|---|---|---|
| 6,694,606 | B1 | 2/2004 | Ohashi et al. |
| 6,817,216 | B2 | 11/2004 | Kou |
| 6,902,090 | B2 | 6/2005 | Yamamura et al. |
| 7,513,389 | B2 | 4/2009 | Kitajima et al. |
| 7,712,208 | B2 | 5/2010 | Watanabe et al. |
| 2004/0078962 | A1 | 4/2004 | Ohashi et al. |
| 2005/0036274 | A1 | 2/2005 | Suhara et al. |
| 2005/0210664 | A1 | 9/2005 | Kitajima et al. |
| 2006/0185162 | A1 | 8/2006 | Aoki et al. |
| 2007/0011869 | A1 | 1/2007 | Watanabe et al. |
| 2009/0119912 | A1 | 5/2009 | Watanabe et al. |

FOREIGN PATENT DOCUMENTS

| | | |
|---|---|---|
| EP | 1494522 | 1/2005 |
| JP | 05-338618 | 12/1993 |

OTHER PUBLICATIONS

European Decision to Grant a European Patent, dated May 12, 2011, directed to European Patent Application No. 06013575.3; 2 pages.
European Decision to Grant a European Patent, dated May 12, 2011, directed to European Patent Application No. 06024781.4; 2 pages.
European Search Report mailed Mar. 23, 2007 for European Patent Application No. 06024781.4; 7 pages.
European Search Report dated May 16, 2007, directed to related EP Application No. 06013575.3; 5 pages.
Watanabe et al., U.S. Office Action, mailed Oct. 6, 2008, directed to U.S. Appl. No. 11/478,434; 7 pages.
Watanabe et al., U.S. Office Action mailed May 11, 2009, directed to U.S. Appl. No. 11/605,471; 10 pages.
European Office Action dated Dec. 29, 2010, directed to EP Application No. 06013575.3; 6 pages.

ELECTRONIC COMPONENT MOUNTING APPARATUS

CROSS-REFERENCE OF THE INVENTION

This application is a divisional of U.S. Ser. No. 11/605,471, filed Nov. 29, 2006, now U.S. Pat. No. 7,712,208, which claims priority from Japanese Patent Application No. 2005-345114, filed Nov. 30, 2005, the contents of which are incorporated herein by reference in their entireties.

BACKGROUND OF THE INVENTION

1. Field of the Invention

The invention relates to an electronic component mounting apparatus having a plurality of component feeding units aligned on a feeder base, the component feeding unit feeding an electronic component stored in a storage tape to a component pickup position, in which a suction nozzle picks the electronic component fed by the component feeding unit and mounts the electronic component on a printed board.

2. Description of the Related Art

In this kind of electronic component mounting apparatus, particularly in a high-speed gantry-type mounting device, since the component feeding units are fixed and not moved, there are rapidly increasing users employing the so-called splicing where storage tapes are connected to each other for supplying the components during automatic driving. A method of connecting storage tapes to each other is disclosed in the Japanese patent application publication No. hei 5-338618 and so on, for example, and a technology of facilitating the connection work is proposed.

However, in a case where the storage tapes are connected to each other with a connection tape when a shortage of electronic components occurs, the storage tapes at a connection portion with the connection tape, i.e., the storage tapes at a seam where the connection tape is attached are shifted due to the attached connection tape. Therefore, positions of a component storage portion and an electronic component stored therein are shifted relative to a position where the suction nozzle lowers to pick up the electronic component at the component feeding unit, thereby causing an error in picking a component and reduction in a pickup rate.

The invention is directed to an unfailing pickup operation of an electronic component from a component storage portion to prevent reduction in a pickup rate of electronic components even in the above case.

SUMMARY OF THE INVENTION

The invention provides an electronic component mounting apparatus including: a feeder base; a component feeding unit disposed on the feeder base and feeding electronic components stored in a storage tape so that each of the electronic components is advanced to a component pickup position where a suction nozzle is configured to pick up the electronic component fed by the component feeding unit for mounting the electronic component on a printed board; a seam detection device provided for the component feeding unit and detecting a seam connecting two storage tapes; a recognition camera taking an image of a storage portion of the storage tape storing the electronic components when the seam is detected; a recognition processing device performing a recognition processing to the image taken by the recognition camera; and a control device adjusting the component pickup position based on a result of the recognition processing of the recognition processing device.

The invention also provides an electronic component mounting apparatus including: a feeder base; a component feeding unit disposed on the feeder base and feeding electronic components stored in a storage tape so that each of the electronic components is advanced to a component pickup position where a suction nozzle is configured to pick up the electronic component fed by the component feeding unit for mounting the electronic component on a printed board; a seam detection device provided for the component feeding unit and detecting a connection tape connecting two storage tapes; a counter counting the feeding of the electronic components to the component pickup position after the seam detection device detects the connection tape; a recognition camera taking an image of a storage portion of the storage tape storing the electronic components the component feeding unit handle when a count number of the counter reaches a first predetermined number that is needed until the connection tape reaches the component pickup position from a time when the connection tape is detected by the seam detection device and thereafter each time when the count number of the counter reaches a second predetermined number; a recognition processing device performing a recognition processing to the image taken by the recognition camera; and a control device adjusting the component pickup position based on a result of the recognition processing of the recognition processing device.

The invention achieves an unfailing pickup operation of an electronic component from a component storage portion at a connection portion, i.e., at a seam of storage tapes connected even using a connection tape, and prevention of reduction in a pickup rate.

DETAILED DESCRIPTION OF THE INVENTION

An electronic component mounting apparatus having an electronic component feeding device and an electronic component mounting apparatus body will be described with reference to the attached drawings. This electronic component mounting apparatus is a so-called multifunctional chip mounter, which can mount a variety of electronic components on a printed board P.

Figure 1:
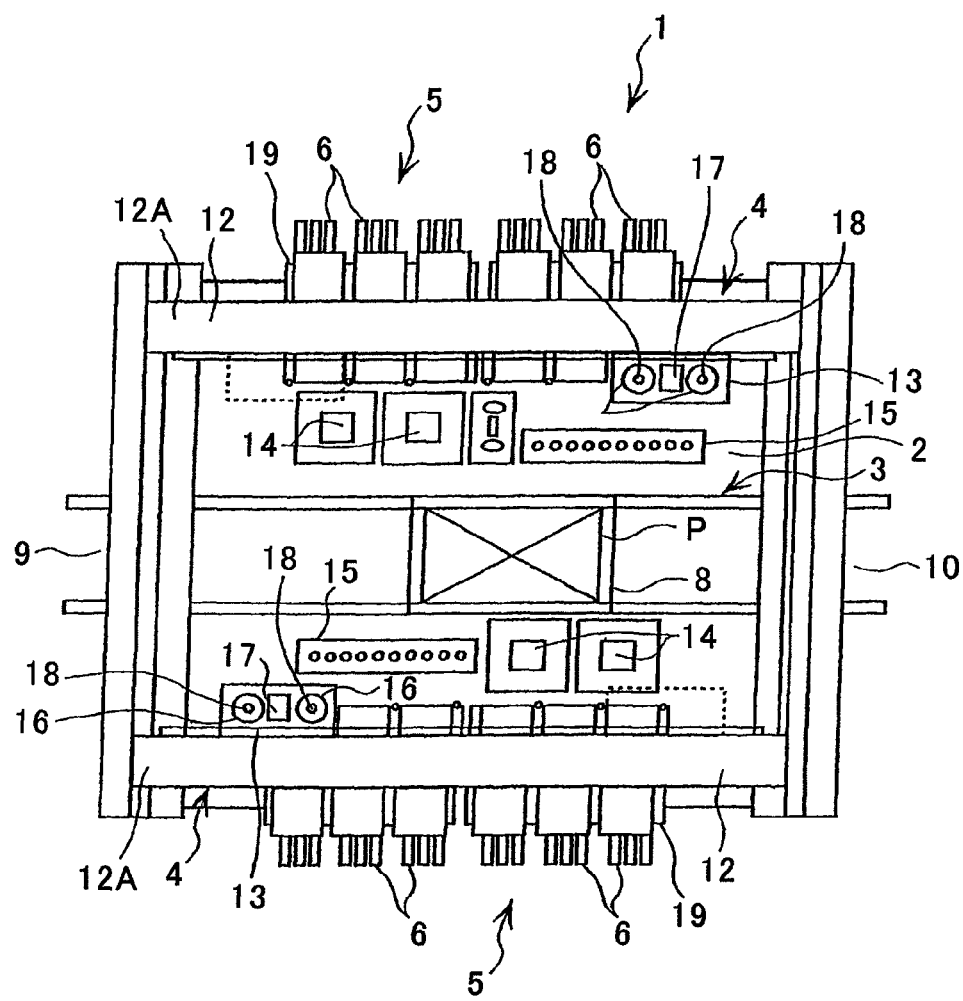
FIG. 1 is a plan view of an electronic component mounting apparatus.

FIG. 1 is a plan view of the electronic component mounting apparatus. An electronic component mounting apparatus body 1 includes a base 2, a conveyer portion 3 extending in a lateral direction in a center of the base 2, and two component mounting portions 4 and two component feeding portions 5 each provided on the front (on a lower side of FIG. 1) and the rear (on an upper side of FIG. 1) of the base 2. Each of the component feeding portions 5 is detachably set with a plurality of component feeding units 6 as the electronic component feeding device, thereby forming the electronic component mounting apparatus.

The conveyer portion 3 includes a central set table 8, a left feeding conveyer 9, and a right discharging conveyer 10. The printed board P is supplied from the feeding conveyer 9 to the set table 8, and is fixed at a predetermined height so as to be mounted with electronic components. After completing the electronic component mounting, the printed board P is discharged from the set table 8 to a downstream device through the discharging conveyer 10.

Each of the component mounting portions 4 is provided with an XY stage (beam) 12 movably mounted with a head unit 13, a component recognition camera 14, and a nozzle stocker 15. The head unit 13 is mounted with two mounting heads 16 for picking up and mounting the electronic components, and a board recognition camera 17 for recognizing the position of the printed board P. Normally, the XY stages 12 of both the component mounting portions 4 are alternately driven.

In each of the XY stages 12, a beam 12A moves in a Y direction driven by a Y axis drive motor 12Y, and the head unit 13 moves in an X direction driven by an X axis drive motor 12X. Therefore, the head unit 13 moves in the X and Y directions.

In each of the component feeding portions 5, many component feeding units 6 are laterally and detachably aligned on a feeder base 19. Each of the component feeding units 6 is provided with a storage tape C storing many electronic components in storage portions Cc aligned at predetermined pitches, which will be described below. By intermittently feeding the storage tape C, the electronic components are fed one by one from an end of the component feeding unit 6 to the component mounting portion 4.

This electronic component mounting apparatus body 1 is driven based on mounting data stored in a storage portion thereof. First, the XY stage 12 is driven, the head unit 13 moves to the component feeding unit 6, and then a suction nozzle 18 of the mounting head 16 is lowered to pick a required electronic component up. Then, the mounting head 16 rises up, and the XY stage 12 is driven to move the electronic component to a position right above the component recognition camera 14. The component recognition camera 14 recognizes a posture and a position of the electronic component on the suction nozzle 18. Next, the mounting head 16 moves to above the printed board P on the set table 8, and the board recognition camera 17 recognizes a position of the printed board P. Then, an X axis drive motor 12X and a Y axis drive motor 12Y of the XY stage 12, and a θ axis drive motor 18A of the suction nozzle 18 are moved by a corrected amount based on a recognition result of the component recognition camera 14 and the board recognition camera 17, and then the electronic component is mounted on the printed board P.

Figure 2:
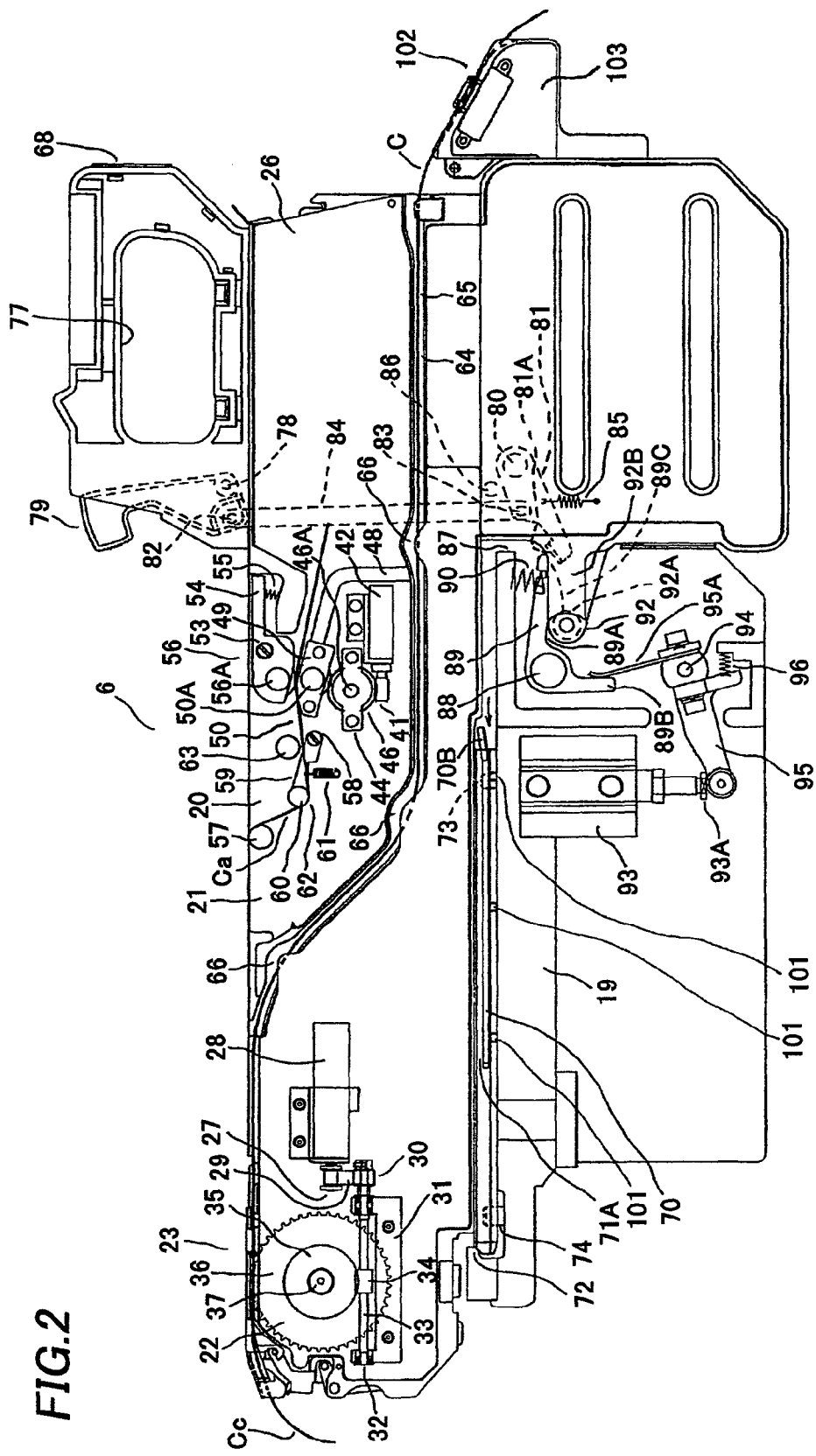
FIG. 2 is a side view of a component feeding unit fixed on a feeder base.
Figure 3:
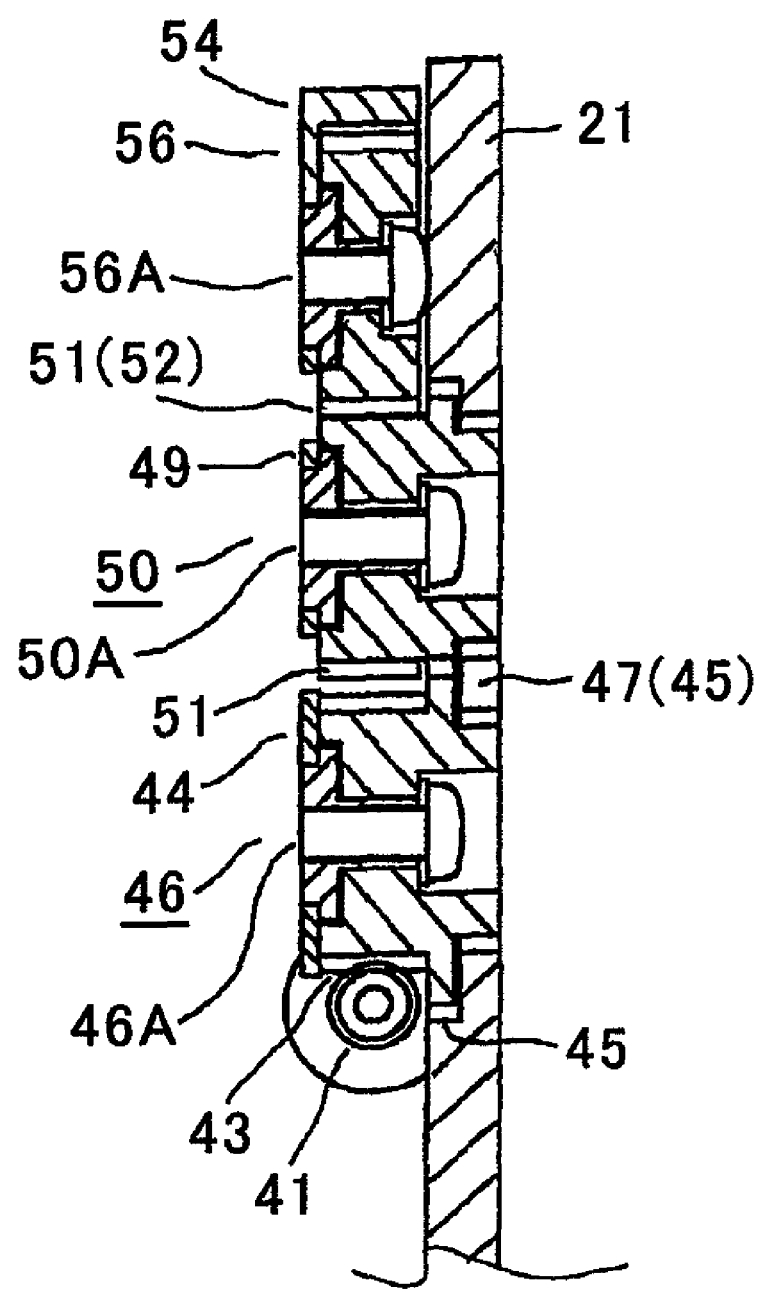
FIG. 3 is a vertical cross-sectional view of a cover tape peeling system of FIG. 2.

Next, the component feeding unit 6 will be described based on FIGS. 2 and 3. The component feeding unit 6 includes a unit frame 21, a storage tape reel (not shown) rotatably mounted on the unit frame 21, a tape feeding system 22 for intermittently feeding the storage tape C let out from the storage tape reel reeled with the storage tape C to a position where the electronic component is picked up by the suction nozzle 18, and a cover tape peeling system 20 for peeling a cover tape Ca from the storage tape C just before the pickup position.

The storage tape C let out from the storage tape reel is fed to the pickup position under a suppressor 23 which is provided just before the pickup position in a tape route. This suppressor 23 is formed with an opening for picking. The suppressor 23 is also formed with a slit. The cover tape Ca of the storage tape C is peeled off at this slit, and stored in a storage portion (storage concave portion) 26. That is, the electronic component stored in the storage tape C is fed to a position to the opening for picking, with the cover tape Ca being peeled off, and picked up by the suction nozzle 18.

Next, the tape feeding system 22 will be explained referring to FIG. 2. The tape feeding system 22 includes a servomotor 28 which is provided with a gear 27 at its output axis and serves as a drive source which can rotate forward and backward, a rotation axis 33 rotatably supported by a supporting body 31 through a bearing 32 and provided with a gear 30 at its end where a timing belt 29 is stretched from the gear 27, and a sprocket 36 provided with a worm wheel 35 engaged with a worm gear 34 provided in a center of the rotation axis 33 and also engaged with feed holes Cb formed in the storage tape C to feed the storage tape C. The support axis 37 of the worm wheel 35 and the sprocket 36 penetrates an intermediate partition body of a unit frame 21.

Therefore, when the servomotor 28 is driven to rotate forward in order to feed an electronic component stored in the storage tape C in the component feeding unit 6, the gear 27 and the gear 30 rotate through the timing belt 29 to rotate the rotation axis 33 only, and the sprocket 36 intermittently rotates by a predetermined angle in a forward direction through the worm gear 34 and the worm wheel 35 to intermittently feed the storage tape C with the feed holes Cb.

Next, the cover tape peeling system 20 will be described. The cover tape peeling system 20 includes a drive motor 42, a first rotating body 46, a second rotating body 50, a third rotating body 56, a roller 57, and a tension applying body 62. The drive motor 42 is provided with a worm gear 41 at its output axis. The first rotating body 46 is provided with a gear 43 engaged with a gear 45 and the gear 41 therearound, and is rotatably supported by a supporting body 44 through a support axis 46A, the supporting body 44 being fixed on the unit frame 21. The second rotating body 50 is provided with a gear 47 engaged with a contact portion 51 and the gear 45 therearound, and is rotatably supported by a supporting body 49 through a support axis 50A, the supporting body 49 being fixed on the unit frame 21 through an attachment body 48. The third rotating body 56 is provided with a contact portion 52 contacting with the contact portion 51 being pushed by a spring 55 therearound, and is rotatably supported by an attachment body 54 through a support axis 56A, the attachment body 54 being fixed on the unit frame 21 and rotatable through a support axis 53. The roller 57 is provided for guiding the cover tape Ca. The tension applying body 62 is provided with the roller 60 for guiding the cover tape Ca guided by the roller 57 on an end of an attachment body 59, the attachment body 59 being fixed on the unit frame 21 and rotatable around a support axis 58, and applies tension to the cover tape Ca being pushed by a spring 61. A numeral 63 designates a stopper for limiting rotation of the attachment body 59 there.

When the cover tape Ca is peeled off, the drive motor 42 is driven to rotate the first rotating body 46 through the gears 41 and 43. By the rotation of the first rotating body 46, the second rotating body 50 rotates through the gears 45 and 47. By rotation of the second rotating body 50, the third rotating body 56 rotates with the cover tape Ca being interposed between the contact portions 52 and 51 pushed by the spring 55. Then, the cover tape Ca is peeled from the storage tape C by a pitch at the slit of the suppressor 23 without generating the slack, and is stored in a storage portion 26 provided in an end of the component feeding unit 6.

The suppressor 23 forms an almost L shape in its cross-section by a vertical piece as a support portion and a horizontal piece pressing the storage tape C of which the feed holes Cb are engaged with the gear teeth of the sprocket 36 for preventing disengagement of the tape C. The vertical piece is supported by the unit frame 21, being rotatable around the support axis as a fulcrum in its rear end portion inside the unit frame 21, and the horizontal piece has a vertical hook piece in its front end portion, the vertical hook piece having hook holes which can be hooked on a hook body (not shown) applied with pressure by a spring in a hooking direction.

The component feeding unit 6 is so formed that the storage tape C can be set on the component feeding unit 6 through the opening for setting 65 connected to a tape route 64 formed from the side of the component feeding unit 6 to the unit frame 21 with the suppressor 23 rotated upward, which serves as a peeling point of the cover tape Ca of the storage tape C. A numeral 66 designates a prevention member for preventing the storage tape C set in the component feeding unit 6 from separating from the opening for setting 65, which is provided to the tape route 64 near its rear end portion, in an intermediate portion of its horizontal portion, near an upper end portion of its slope portion, in a boundary portion between the horizontal portion and the slope portion, and so on (see FIG. 2).

A numeral 68 designates a label attached to a rear side of a handle 77 of the component feeding unit 6, where a barcode indicating a serial number of the component feeding unit 6 is written. Thus, even when the plurality of component feeding units 6 is set aligned close to each other on the electronic component mounting apparatus body 1, the barcodes can be read out by a barcode scanner (not shown).

Figure 4:
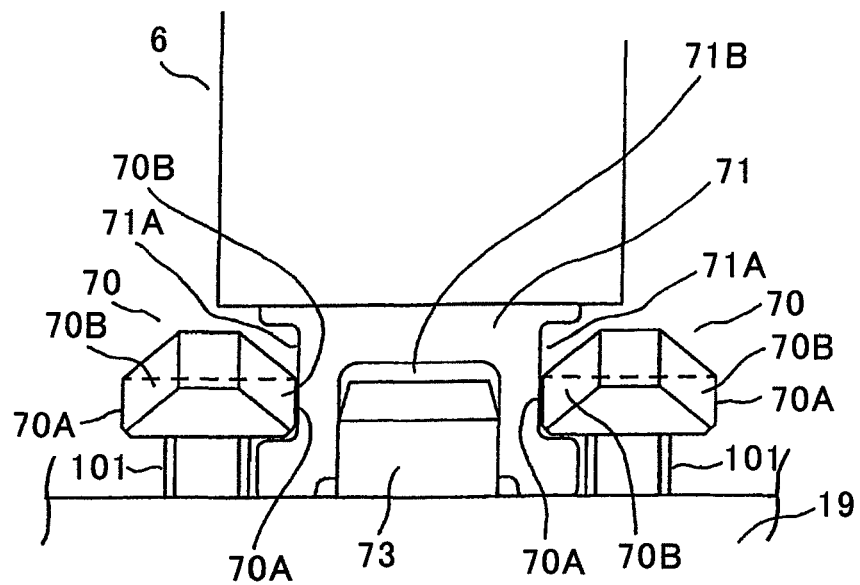
FIG. 4 is a view from an arrow X in FIG. 2, showing a relation of the component feeding unit and the feeder base.
Figure 5:
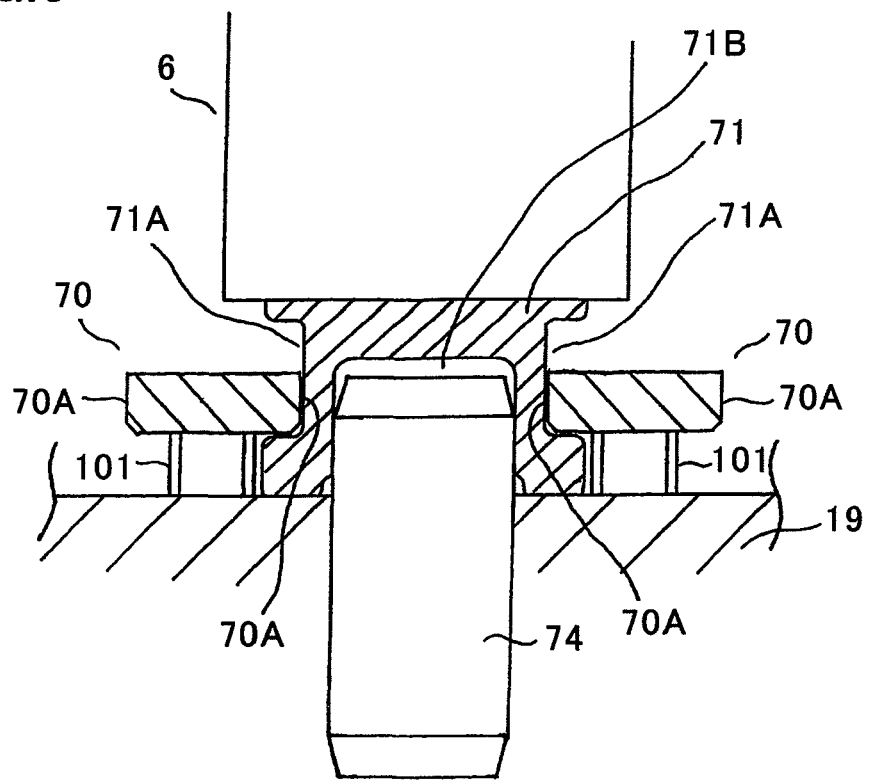
FIG. 5 is a cross-sectional view of FIG. 2 in a position of a front left-to-right control pin, showing the relation of the component feeding unit and the feeder base.

The structure of the component feeding units 6 which are detachably set aligned on the feeder base 19 will be described. First, a pair of guiding members 70 guiding each of the component feeding units 6 and having parallel sides 70A is provided on an upper surface of the feeder base 19 by a plurality of attachment pins 101, and a guided member 71 having a U-shape in its cross-section is provided on a bottom side of the component feeding unit 6, having concave portions 71A on its outer sides where the pair of the guiding members 70 are fit to guide the guided member 71, as shown in FIGS. 1, 4, and 5. The front end portions of the pair of guiding members 70 slopes upward, and are formed with sides 70B facing but increasing in these interval toward the front side.

Although the pair of guiding members 70 is provided for the component feeding unit 6, these guiding members 70 are also used as the guiding members 70 for the adjacent component feeding units 6 since the plurality of component feeding units 6 is set aligned.

A front-to-rear control member 72 is provided, which controls the position of the component feeding unit 6 in a front-to-rear direction by making the guided member 71 reach the end portion of the feeder base 19 in its depth side when the guided member 71 is moved for mounting the component feeding unit 6, being guided by the pair of guiding members 70 and sliding on the feeder base 19.

A cylindrical rear left-to-right control pin 73 is provided on the feeder base 19 between the sides 70A of the guiding members 70 in its front portion, being engaged with a control groove 71B of the guided member 71 to control the position of the component feeding unit 6 in the left-to-right direction. Furthermore, a cylindrical front left-to-right control pin 74 is provided in a position near the front-to-rear control member 72 where the guiding member 70 is not provided, being engaged with the control groove 71B of the guided member 71 to control the position of the unit 6 in the left-to-right direction.

Since the control groove 71B of the guided member 71 is to control the position of the component feeding unit 6 in the left-to-right direction by being engaged with the front left-and-right control pin 74 having a larger diameter than that of the rear left-to-right control pin 73, the control groove 71B is formed to have almost the same width as the diameter of the front left-to-right control pin 74 in the position where the front left-to-right control pin 74 is engaged and to have almost the same width as the diameter of the rear left-to-right control pin 73 in the position where the rear left-to-right control pin 73 is engaged, in order to control the position of the unit 6 in the left-to-right direction when the component feeding unit 6 is fixed to the feeder base 19.

The handle 77 and a lock release lever 79 which is rotatable around a support axis 78 as a fulcrum are formed in the rear portion of the component feeding unit 6. A lock release member 81 having a contact portion 81A and supported rotatably around a support axis 80 as a fulcrum and the lock release lever 79 are connected to each other through a connection plate 84 which is rotatably supported by support axes 82 and 83. Although the lock release member 81 is pulled by a spring 85 so as to rotate in a counterclockwise direction, the rotation in the counterclockwise direction is controlled by a control pin 86.

A coil spring 90 is stretched between an attachment member 87 of the feeder base 19 and a hook member 89 which is rotatable around a support axis 88 as a fulcrum, and applies pressure to the hook member 89 so as to rotate the member 89 in the clockwise direction, the hook member 89 having a first hook member 89A which can be hooked on the first lock member 92 provided on the component feeding unit 6. The first lock member 92 includes a roller 92A and a support member 92B provided with the roller 92A. The lock release lever 79, the lock release member 81, the connection plate 84, and so on form a release device releasing hooking of the first hook member 89A of the hook member 89 from the roller 92A of the first lock member 92.

When the component feeding unit 6 is to be mounted on the feeder base 19, an operator holds the handle 77 and moves the component feeding unit 6 in the depth direction with the guided member 71 guided by the guiding member 70, and the roller 92A is hooked on the first hook member 89A after the roller 92A is in contact with the guide portion 89C of the hook member 89 provided on the electronic component mounting apparatus body 1 and the hook member 89 is being rotated in the counterclockwise direction.

A numeral 93 designates a lock cylinder forming an activating member provided on the electronic component mounting apparatus body 1, and one end portion of a second lock member 95 which is rotatable around a support axis 94 as a fulcrum is in contact with a rod 93A of the lock cylinder 93, being applied with pressure by a spring 96. When the lock cylinder 93 is activated and its rod 93A extends, the second lock member 95 provided on the electronic component mounting apparatus body 1 is rotated in the counterclockwise direction, and a lock lever 95A on another end of the second lock member 95 becomes in contact with a second hook member 89B of the hook member 89, thereby limiting the rotation of the hook member 89 in the counterclockwise direction.

Although the hook member 89 is provided for each of the component feeding units 6, the lock cylinder 93 and the second lock member 95 are provided for the plurality of the component feeding units 6. Therefore, the lock lever 95A is extended in the alignment direction of the component feeding units 6.

Figure 6:
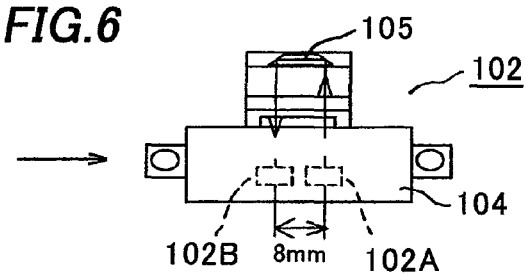
FIG. 6 is a side view of a seam detection device.
Figure 7:
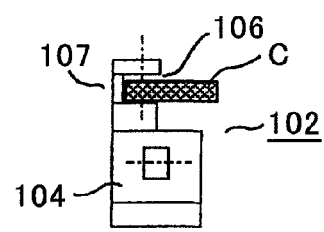
FIG. 7 is a view of the seam detection device from an arrow in FIG. 6.

In FIGS. 6 and 7, a numeral 102 designates a seam detection device for the storage tape C, which is provided on an attachment member 103 attached to the rear end portion of the component feeding unit 6. This seam detection device 102 includes a device body 104 provided with a light emissive element 102A and a light receiving element 102B at an interval of 8 mm, and a route formation body 107 having a prism 105 on its upper end portion, a U-shape in its cross-section, and a tape route opening portion 106 in its middle portion so that the storage tape C can pass therethrough.

That is, in the feeding operation of the storage tape C, the storage tape C without a seam can be detected as having no seam by the seam detection device 102 since light from the light emissive element 102A is reflected by the prism 105 and returned therefrom through feed holes (formed at intervals of 4 mm) Cb and received by the light receiving element 102B. The storage tape C with the seam is detected as having a seam since light from the emissive element 102A is blocked by the connection tape 108A covering the feed holes Cb and not received by the light receiving element 102B in the feeding operation (see FIGS. 8 and 9).

It is noted that the connection tape 108A connects an old storage tape C where the number of electronic components is reduced and a new storage tape C, with the connection tapes 108B and 108C, and a portion where the connection tape 108A is attached is a seam.

Figure 10:
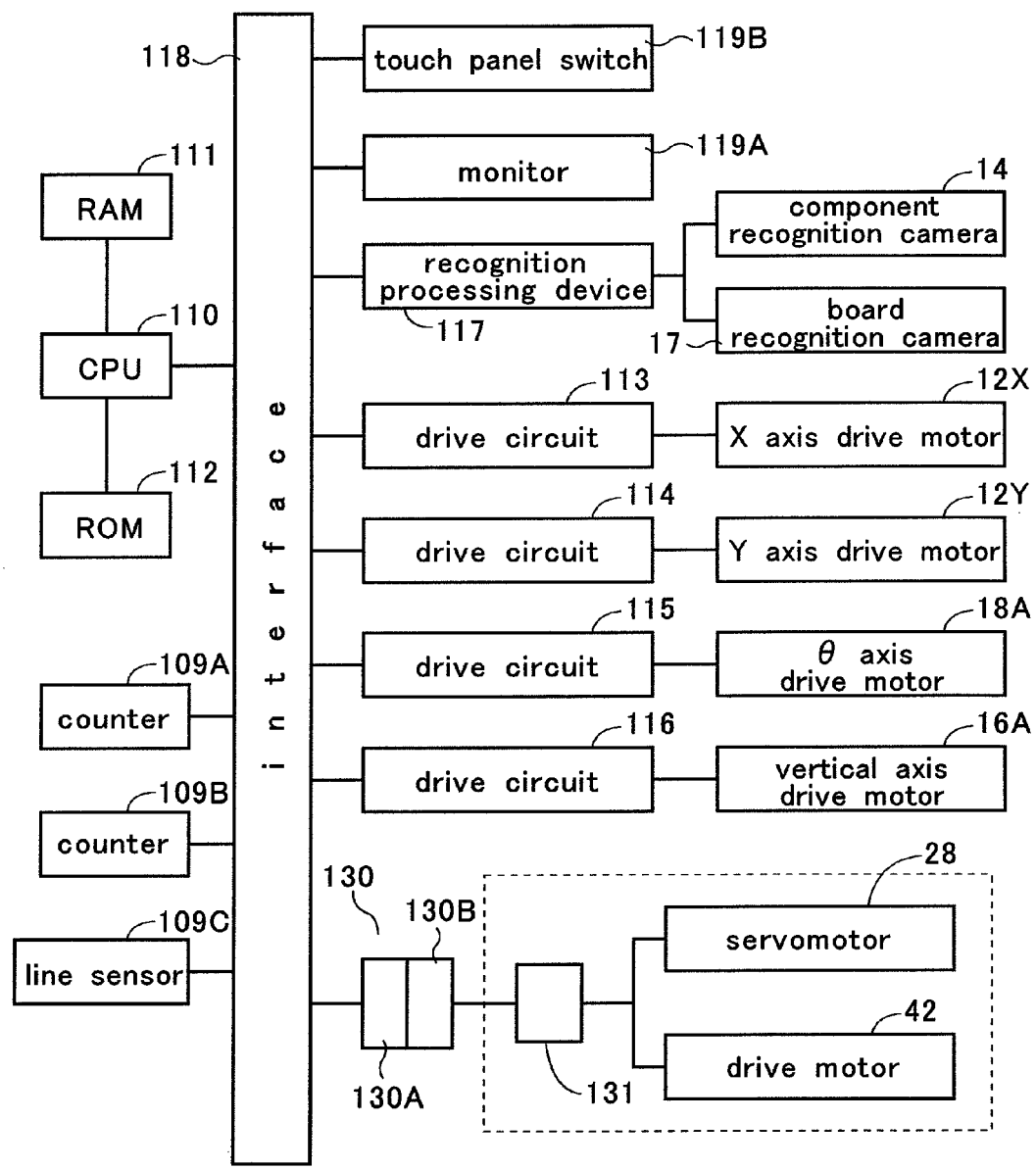
FIG. 10 is a control block diagram.

Next, a control block diagram of the electronic component mounting apparatus of this embodiment shown in FIG. 10 will be described. A numeral 110 designates a CPU as a control portion for controlling the operation of mounting the electronic component of the electronic component mounting apparatus, a numeral 111 designates a RAM (random access memory) as a memory device, and a numeral 112 designates a ROM(read only memory).

The RAM 111 is stored with mounting data for each of types of the printed board P, which include values in the X and Y directions and an angle on the printed board, alignment numbers of the component feeding units 6, and so on in order of component mounting (in order of step number). The RAM 111 is also stored with component disposition data which include types of the electronic components (component ID) corresponding to the alignment numbers (lane numbers) of the component feeding units 6. The RAM 111 is further stored with an interval and the number of times for recognizing the storage portion (a storage concave portion) when the seam is detected, that will be described below, for each of types of the electronic components. The RAM 111 is further stored with component library data including items indicating features of the electronic component in each of ID.

Then, the CPU 110 controls a component mounting operation of the electronic component mounting apparatus based on data stored in the RAM 111 and according to a program stored in the ROM 112. That is, the CPU 110 controls driving of the X axis drive motor 12X, the Y axis drive motor 12Y, the θ axis motor 18A, and the vertical axis motor 16A vertically moving the mounting head 16 respectively through the drive circuit 113, the drive circuit 114, the drive circuit 115, and the drive circuit 116.

A numeral 117 designates a recognition processing device connected with the CPU 110 through an interface 118. The recognition processing device 117 performs recognition processing to images taken and stored by the component recognition camera 14 or the board recognition camera 17, and sends a recognition result to the CPU 110. That is, the CPU 110 outputs a command to perform recognition processing (e.g. calculation of a shifting amount of an electronic component from a proper position) to images taken and stored by the component recognition camera 14 or the board recognition camera 17 to the recognition processing device 117, and receives a recognition processing result from the recognition processing device 117.

That is, when the recognition processing device 117 performs recognition processing and recognizes a shifting amount from a proper position, this recognition result is sent to the CPU 110. Then, the CPU 110 control the apparatus body 1 to move the X axis drive motor 12X and the Y axis drive motor 12Y of the XY stage 12, and the θ axis motor 18A of the suction nozzle 18 by a corrected amount and mount the electronic component on the printed board P.

Various touch panel switches 119B as input means for data setting are provided on a monitor 119A as a display device, and an operator can make various settings by operating the touch panel switches 119B. Set data is stored in the RAM 111. A numeral 109A designates a counter provided for each of the component feeding units 6, and counts the number of times the storage tape C is fed from the time when the seam detection device 102 first detects the connection tape 108A (the seam) (the number of times the CPU 110 sends a feeding command). The number of times the tape C is fed until the first electronic component, i.e., the most upstream electronic component stored at the seam reaches the electronic component pickup position from the time when this seam is detected by the seam detection device 102 is N. N is calcurated by dividing a distance of feeding the storage tape C from a position where the seam is detected by the seam detection device 102 to the electronic component pickup position by a tape feeding pitch (i.e., one feeding distance of a tape or an interval of the component storage portions Cc). A numeral 109B designates a counter provided for each of the component feeding units 6 and counting the number of times a pickup error occurs. It is detected that the suction nozzle 18 holds an electronic component or no electronic component by a line sensor 109C provided on the mounting head 16 or the component recognition process, and the counter 109B counts the number of sequential times the suction nozzle 18 is detected as holding no component or holding the component improperly. It is noted that FIG. 10 shows only each one of the counters 109A and 109B for convenience although the counters 109A and 109B are provided for each of the component feeding units 6.

A numeral 130 designates a connector connected to the CPU 110 through the interface 118. The connector 130 includes each electronic component mounting apparatus side connector 130A and each component feeding unit side connector 130B which is detachably attached to the connector 130A, and the component feeding unit side connector 130B is connected to the servomotor 28 and the drive motor 42 through a drive circuit 131. It is noted that FIG. 10 shows only each one of the connectors 130, the drive circuits 131, the servomotors 28, and the drive motors 42 for convenience although those are provided for each of the component feeding units 6.

Next, an operation of picking and mounting the electronic component will be described. First, the CPU 110 sends a command to the component feeding unit 6 which feeds an electronic component belonging to the first step number of the mounting order in the mounting data (data on the position, posture, or types of the component to be mounted on a printed board), and drives the servomotor 28 and the drive motor 42 of the component feeding unit 6 to perform the component feeding operation and the peeling operation of the cover tape Ca.

Then, the CPU 110 judges whether or not the component feeding unit 6 is dismounted from the feeder base 19 and mounted back thereon, whatever the cause is.

In detail, when an operator operates an operating portion (not shown) of the electronic component mounting apparatus first, the CPU 110 activates the lock cylinder 93 to draw the rod 93A, rotates the second lock member 95 around the support axis 94 as a fulcrum in the clockwise direction. Then, the lock lever 95A at another end portion of this second lock member 95 is separated from the second hook portion 89B of the hook member 89 to provide a state where this hook member 89 can rotate in the counterclockwise direction. Thus, when the operator puts, for example, a thumb on the rotatable lock release lever 79, puts the other fingers inside the handle 77, and draws the lever 79 by the thumb, the lock release lever 79 rotates around the support axis 78 as a fulcrum in the clockwise direction, the lock release member 81 rotates in the clockwise direction, the contact portion 81A pushes up the guide portion 89C of the hook member 89 against the pressure of the coil spring 90, the hook member 89 is rotated in the counterclockwise direction, and the roller 92A is separated from the first hook portion 89A (unhooked). Therefore, the operator draws the component feeding unit 6 toward the operator with holding the handle 77, and the guided member 71 is moved toward the operator, being guided by the guiding member 70, thereby separating the component feeding unit 6 from the feeder base 19. Then, the operator moves the component feeding unit 6 in the depth direction with holding the handle 77 while the guided member 71 is guided by the guiding member 70, and can mount the component feeding unit 6 on the feeder base 19.

At this time, it is necessary to disconnect the electronic component mounting apparatus side connector 130A from the component feeding unit side connector 130B when the component feeding unit 6 is dismounted from the feeder base 19, and to connect the electronic component mounting apparatus side connector 130A and the component feeding unit side connector 130B when the component feeding unit 6 is mounted back on the feeder base 19. Since the CPU 110 always monitors the component feeding unit 6, the CPU 110 can judge that the component feeding unit 6 is dismounted from the feeder base 19 and mounted back thereon, according to a signal inputted from the component feeding unit 6 through the interface 118.

When the CPU 110 judges that the unit 6 is dismounted and mounted back, the CPU 110 moves the board recognition camera 17 to the pickup position of the component feeding unit 6 which is dismounted and mounted back by driving the X axis drive motor 12X and the Y axis drive motor 12Y, the camera 17 takes an image of the storage portion Cc of the storage tape C, and the recognition processing device 117 performs recognition processing to the image. When this recognition processing is performed, since the size data of the storage portion Cc forming a rectangle in its planar view is stored in the RAM 111, the processing device 117 can recognize either one of the edge of the storage portion Cc and the edge of the electronic component if the electronic component is stored in the storage portion Cc, which has the nearest size to the size data, to be that of the component storage portion Cc. Therefore, the storage portion Cc and the electronic component stored in the storage portion Cc can be discriminated from each other.

Then, based on a result of the recognition processing, a correction value is stored in the RAM 111, and the X axis drive motor 12X and the Y axis drive motor 12Y are driven taking this correction value into account, then the vertical axis drive motor 16A is driven, and the suction nozzle 18 lowers and picks the electronic component by suction.

In a case where it is judged that the component feeding unit 6 is not dismounted from the feeder base 19 and mounted back thereon when it is checked whether or not the component feeding unit 6 is dismounted from the feeder base 19 and mounted back thereon, the CPU 110 judges whether or not the count number of the counter 109A, which is the number of times a feeding command is sent, reaches N after the detection device 102 detects the seam of the storage tape C.

Figure 11:
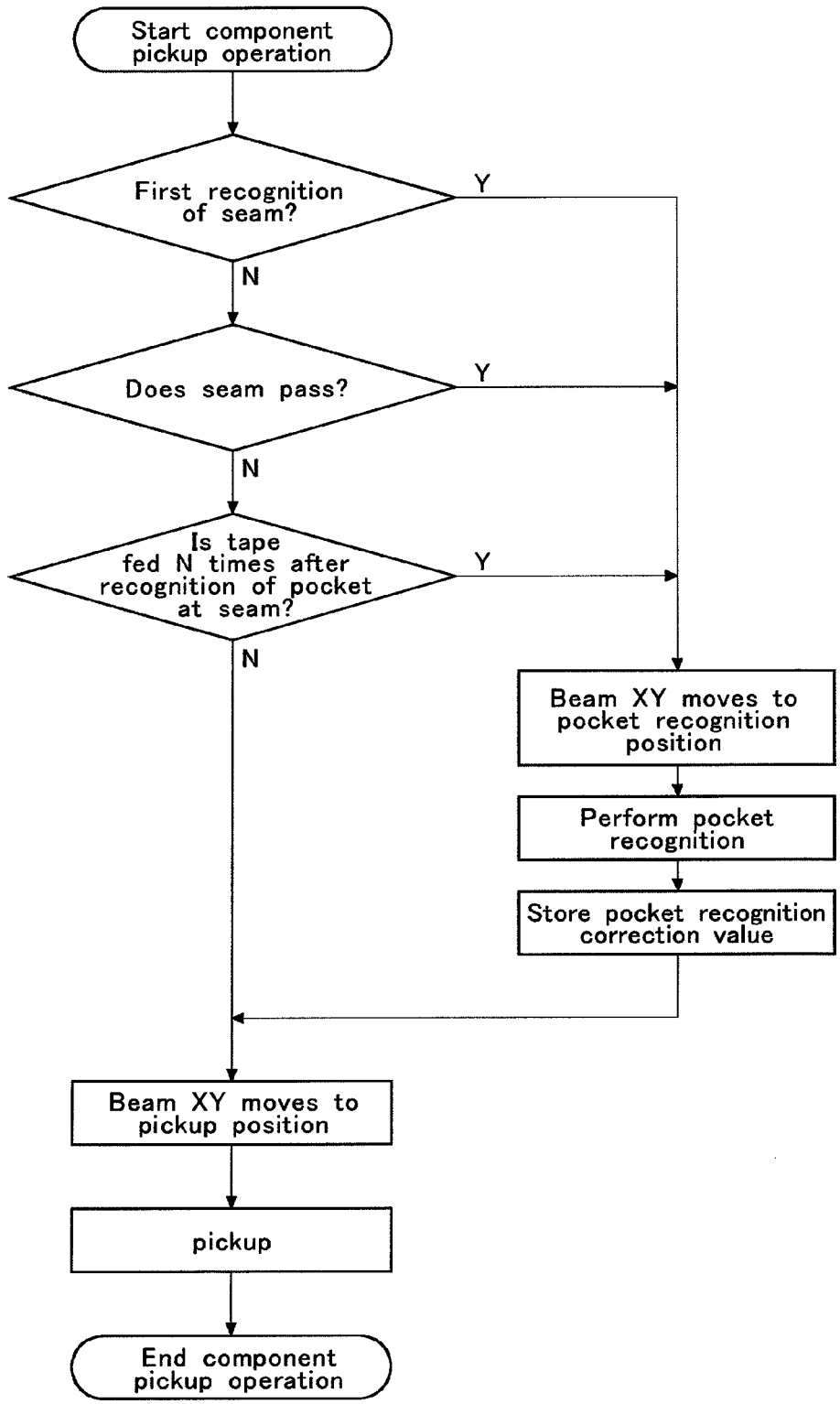
FIG. 11 is a flow chart.

Hereafter, description will be given on an operation of picking up an electronic component, particularly, the operation when the seam is detected by the seam detection device 102 based on a flow chart of FIG. 11.

When the seam detection device 102 detects the seam portion of the tape, which corresponds to the connection tape 108 in this embodiment, the CPU 110 counts the number of the advancements of the feeding tape until the count reaches a predetermined number N. This number N is determined so that after "N" advancements of the tape the electronic component in the storage portion Cc corresponding to the leading edge of the connection tap 108 comes to the electronic component pickup position. It is preferable that this number is a little larger than the required number so that the storage portions Cc corresponding to the leading side of the connection tape 108 (storage portions Cc in the tape on the left shown in FIG. 8) come to the pickup position. In a case where the count value reaches N, as described above, the CPU 110 judges that the seam portion reaches the pickup position, drives the X axis drive motor 12X and the Y axis drive motor 12Y and to move the head unit 13 to the pickup position of the feeding unit 6 and the board recognition camera 17 to above the storage portion Cc of the storage tape C (a pocket recognition position) to take an image of the storage portion Cc, performs recognition processing (performs pocket recognition), calculates a shifting amount of a center position of this storage portion Cc from a previously set center position, moves the suction nozzle 18 by correction based on the shifting amount, i.e., drives the X axis drive motor 12X and the Y axis drive motor 12Y and then drives the vertical movement axis drive motor 16A, and then the component pickup operation is performed. The calculated shifting amount (a correction value) is stored in the RAM 111. When the next electronic component is to be picked up, too, the suction nozzle 18 is moved by correction based on the shifting amount and picks up the electronic component, and after the component recognition processing the picked electronic component is mounted in a predetermined position of a board.

The feeding of the connection tape 108A and the pickup and mounting operation of the electronic component are then repeatedly continued. While the connection tape 108A (the seam portion) is lying in the pickup position, each time when the connection tape 108 is fed the predetermined number of times (e.g. each time when the tape 108 is fed three times or once for each three storage portions Cc), i.e., at the intervals for recognition stored in the RAM 111, the board recognition camera 17 moves to above a storage portion Cc of the storage tape C (the pocket recognition position) and takes an image of the storage portion Cc, the recognition processing (the pocket recognition) is performed, a shifting amount of a center position of this storage portion Cc from the previously set center position is calculated, and the suction nozzle 18 is moved by correction based on the shifting amount (the correction value), before the component pickup operation is performed. The calculated shifting amount (the correction value) is then stored in the RAM 111.

In this manner, the component pickup operation is performed after the storage portion Cc is recognized and the suction nozzle 18 is moved by correction based on the calculated shifting amount each time when the connection tape 108A, i.e., the seam portion is fed the predetermined number of times while the connection tape 108A is lying in the pickup position. Therefore, even when the connection tape 108A is lying in the pickup position and when the storage tape C is shifted and thus the storage portion Cc is shifted from a predetermined position due to the connection tape 108A, an electronic component can be picked up by the suction nozzle 18 without fail and a pickup error of an electronic component is prevented, thereby retaining a pickup rate even when the storage tapes C are connected to each other.

Furthermore, the recognition processing of the storage portion Cc while the connection tape 108A is lying in the pickup position is preferably performed not each time when the connection tape 108A is fed but each time when it is fed the predetermined number of times, i.e., each time when a predetermined number of components is fed to the pickup position, thereby minimizing reduction of a component feeding speed or a pickup speed. Note that this predetermined number is generally a number different from the predetermined number N described above.

While the connection tape 108A (the seam portion) is lying in the pickup position and the storage tape C is being fed, the recognition processing of the storage portion Cc is performed the predetermined number of times previously stored in the RAM 111, as described above. In detail, when the length of the connection tape 108A is, for example, 60 mm, the interval (pitch) of the storage portions Cc is 2 mm (i.e., one feeding distance of the storage tape C is 2 mm), there are 60÷2=30 pieces of storage portions Cc at the connection tape 108A (the seam portion), and the interval for recognition is three storage portions Cc (each time when the storage tape C is fed three times), the recognition processing is performed 30÷3=10 times, and after each of these processings the shifting amount of the center position of the storage portion Cc from the previously set center position is calculated, the suction nozzle 18 is moved by correction based on the calculated shifting amount, and the component pickup operation is performed. The length of the connection tape 108A, the interval (pitch) of the storage portions Cc, and the interval for recognition are previously set in the RAM 111 by the operation of the touch panel switch 119B by an operator. The number of the storage portions Cc at the connection tape 108A and the number of times for performing the recognition processings are calculated by the CPU 110 and stored in the RAM 111.

Figure 8:
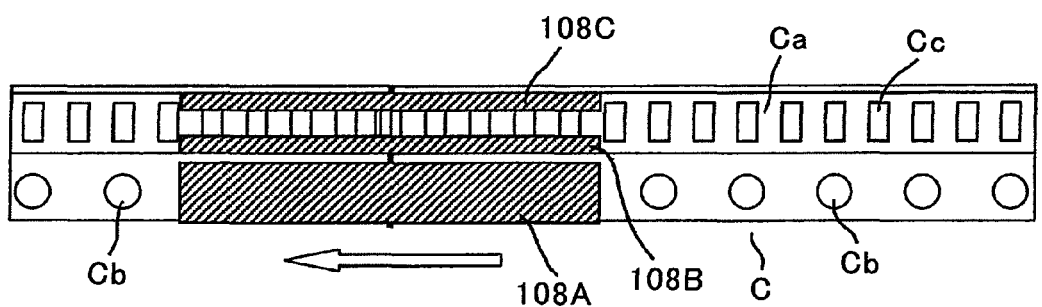
FIG. 8 is a plan view of storage tapes connected to each other with a connection tape.
Figure 9:
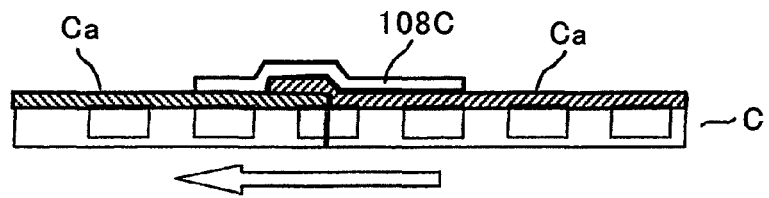
FIG. 9 is a side view of the storage tapes connected to each other with the connection tape.

While the connection tape 108A is fed and the recognition processing is performed in the above described manner, when the storage tape C is fed N times from the time when the seam detection device 102 misses the seam portion, i.e., from the time when the connection tape 108A passes the seam detection device 102, the CPU 110 judges that the connection tape 108A, i.e., the seam portion passes the pickup position and the storage tape C following the connection tape 108A (the storage tape on the right side of the connection tape 108A in FIG. 8) reaches the pickup position. Then, the described recognition processing is performed to a storage portion Cc once, for example, a shifting amount of a center position of this storage portion Cc from the previously set center position is calculated, the suction nozzle 18 is moved by correction based on the shifting amount, and then the component pickup operation is performed. The calculated shifting amount is then stored in the RAM 111, and in each of the subsequent pickup operations the suction nozzle 18 is moved based on the stored shifting amount and picks up the electronic component from the storage portion Cc. Therefore, even when the storage tape C following the connection tape 108A is shifted due to the connection tape 108A, the suction nozzle 18 picks up an electronic component from the storage portion Cc without fail.

It is possible that the CPU 110 judges that the first storage portion Cc in the storage tape C following the connection tape 108A (the storage tape on the right side of the connection tape 108A in FIG. 8) reaches the pickup position when the feeding operation is performed N times from the time when the seam detection device 102 detects the connection tape 108A and the connection tape 108A is further fed predetermined times (30 times) that is needed for passing the pickup position.

In a case where the count value of the counter 109A does not reach N, however, the number of sequential times a suction error occurs is counted by the counter 109B, and when the CPU 110 judges that the count number reaches M, the board recognition camera 17 takes an image of the storage portion Cc of the storage tape C, the recognition processing is performed, the suction nozzle 18 is moved by a corrected amount, and then the pickup operation of the electronic component is performed, as described above. The suction error is a case where the line sensor 109C or the component recognition camera 14 detects the suction nozzle 18 as holding no electronic component or holding the electronic component with improper posture.

In a case where the number of sequential times a suction error occurs counted by the counter 109B does not reach M yet, however, the CPU 110 judges whether or not a pickup rate is lower than a predetermined value. In detail, in a case where a value calculated by dividing the number of times the suction error occurs by the number of times the component is picked up becomes higher than the predetermined value and a pickup rate is thus reduced, the board recognition camera 17 takes an image of the storage portion Cc of the storage tape C, the recognition processing is performed to the image, the suction nozzle 18 is moved by a corrected amount, and then the pickup operation of the electronic component is performed, as described above.

The described operation is performed in mounting order indicated in the mounting data until the mounting data of the next step number does not exist.

The judge and the pickup operation of the electronic component by the suction nozzle 18 are thus performed.

It is also possible that the CPU 110 divides the length of the storage tape C set on the component feeding unit 6 stored in the RAM 111 by a feeding pitch of the storage tape, recognizes the remaining number of the electronic components, stores the number in the RAM 111, and always monitors the remaining number by subtracting 1 from the remaining number in the counter after each of the feeding operations, instead of detecting the seam by the seam detection device 102. That is, the CPU 110, the RAM 111, the counter, and so on form a monitoring device. Thus, when the remaining number reaches a predetermined number, a need for splicing for connecting the old storage tape to the new storage tape is announced and the splicing is performed. Then, after the predetermined number of electronic components are fed (it is preferable to set the predetermined number slightly more than need be so that the new storage tape can surely reach the pickup position), the board recognition camera 17 takes an image of the storage portion Cc of the storage tape C, the recognition processing is performed, the suction nozzle 18 is moved by a corrected amount, and then the pickup operation of the electronic component is performed, as described above.

It is possible to perform the recognition processing to the storage portion Cc, calculate the shifting amount, and move the suction nozzle 18 by correction based on the shifting amount before the component pickup operation each time when the tape C is fed predetermined times (e.g. three times) as described above when an electronic component is to be picked up from a predetermined part of the storage tape C that is located before the connection tape 108A, e.g., from a 20 mm part before the connection tape 108A (a part located on the left side of the connection tape 108A in FIG. 8, that is previously set and stored in the RAM 111 by the operation of the touch panel switch 119B by an operator). In this manner, by performing the recognition processing to the storage portion Cc of the storage tape C and moving the suction nozzle 18 by correction based on the shifting amount in a predetermined part of the connection tape 108A, the suction nozzle 18 can pick up an electronic component from the storage portion Cc without fail to prevent the pickup error even when the storage tape C located before the connection tape 108A is shifted due to the connection tape A.

Although the so-called multifunctional chip mounter is used as an example of the electronic component mounting apparatus in the above description, the invention is not limited to this and can be also applied to a high speed type chip mounter such as a rotary table type.

The component feeding unit can be mounted on a cart detachably connected to the body, and the feeder base can be provided on a cart.

Although a particular preferred embodiment of the invention has been disclosed in detail, it will be recognized that variations or modifications of the disclosed apparatus are possible based on the disclosure for those skilled in the art and lie within the scope of the present invention.

What is claimed is:

1. An electronic component mounting apparatus comprising:
    a feeder base;
    a component feeding unit disposed on the feeder base and advancing a storage tape having storage portions containing electronic components therein so that each of the electronic components comes to a component pickup position where a suction nozzle is configured to pick up the electronic component fed by the component feeding unit for mounting the electronic component on a printed board;
    a seam detection device provided for the component feeding unit and detecting a connection tape connecting two storage tapes;
    a counter counting the advancement of the storage tape, the counter being configured to count a first predetermined number corresponding to the advancement of the storage tape after the connection tape is detected by the seam detection device to the component pickup position;
    a recognition camera configured to take an image of one of the storage portions of the storage tape when the counter counts to the first predetermined number;
    a recognition processing device performing a recognition processing to the image taken by the recognition camera; and
    a control device configured to adjust the component pickup position based on a result of the recognition processing of the recognition processing device.

2. The electronic component mounting apparatus of claim 1, wherein the recognition camera is configured to take an image of another one of the storage portions of the storage tape when the counter counts a second predetermined number after the counter counts the first predetermined number.

* * * * *